United States Patent
Watanabe et al.

(10) Patent No.: US 6,176,986 B1
(45) Date of Patent: *Jan. 23, 2001

(54) SPUTTERING TARGET OF DIELECTRICS HAVING HIGH STRENGTH AND A METHOD FOR MANUFACTURING SAME

(75) Inventors: Kazuo Watanabe; Akifumi Mishima, both of Omiya (JP)

(73) Assignee: Mitsubishi Materials Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/863,194

(22) Filed: May 27, 1997

(30) Foreign Application Priority Data

May 27, 1996 (JP) .................................................. 8-1317369

(51) Int. Cl.⁷ ................................ C23C 14/34; B22F 3/10
(52) U.S. Cl. .......................... 204/298.13; 419/49; 419/19
(58) Field of Search .......................... 29/600, 840, 25.35; 427/394, 252, 421, 99; 423/598; 204/192.12, 192.15, 298.12, 298.13, 192.18; 118/715; 252/62.9 R; 501/137, 138, 139; 419/48, 49, 19

(56) References Cited

U.S. PATENT DOCUMENTS

| 4,534,956 | * | 8/1985 | Arendt et al. ................... 252/62.9 R |
| 4,888,246 | * | 12/1989 | Kuwata et al. .................. 204/192.15 |
| 5,359,760 | * | 11/1994 | Busse et al. ........................ 29/25.35 |
| 5,557,286 | * | 9/1996 | Varadan et al. ....................... 501/137 |
| 5,614,252 | * | 3/1997 | McMillan et al. ...................... 427/99 |
| 5,635,433 | * | 6/1997 | Sengupta ............................. 501/137 |
| 5,660,887 | * | 8/1997 | Werenicz et al. ..................... 427/394 |
| 5,709,783 | * | 1/1998 | Sanchez et al. ................. 204/192.18 |
| 5,771,567 | * | 7/1998 | Pierce et al. ........................... 29/600 |

FOREIGN PATENT DOCUMENTS

| 6-264231 | | 9/1994 | (JP) . |
| 6-264230 | * | 9/1994 | (JP) ................................. 204/298.13 |
| 6-330297 | * | 11/1994 | (JP) ................................. 204/298.13 |

OTHER PUBLICATIONS

S Balakumar et al., "Preparation, morphology and x–ray diffraction studies on barium strontium titanate single crystals," 1995, Materials Research Bulletin, vol. 30, No. 7, pp. 897–907.*

German Official Action Dated Sep. 8, 1997 With Translation of Official Letter.

* cited by examiner

Primary Examiner—Nam Nguyen
Assistant Examiner—Gregg Cantelmo
(74) Attorney, Agent, or Firm—Oblon, Spivak, McClelland, Maier & Neustadt, P.C.

(57) ABSTRACT

A dielectric sputtering target of high strength comprising a sintered barium, strontium titanate body, which is oxygen deficient, of the formula: $Ba_{1-x}Sr_xTiO_{3-y}$, wherein $0<x<1$ and $0<y\leq0.03$, the sintered body having a mean grain size of 0.3 to 5 μm, a maximum grain size of 20 μm or less, a relative density of 95% to 99%, a purity of 4N or more, a K content of 1 ppm or less, a Na content of 2 ppm or less, an Al content of 5 ppm or less, a Si content of 20 ppm or less, an Fe content of 2 ppm or less and a mean flexural strength of 150 MPa or more.

6 Claims, No Drawings

SPUTTERING TARGET OF DIELECTRICS HAVING HIGH STRENGTH AND A METHOD FOR MANUFACTURING SAME

BACKGROUND OF THE INVENTION

1. Field of the Invention

The present invention relates to a dielectric sputtering target having high strength for forming capacitor films of highly integrated semiconductor memories of the next generation and to thin films of functional dielectric, and to a method for producing the same.

2. Description of the Background

It is known, as disclosed in Japanese Unexamined Patent Publication 6-330297, that sputtered films can be formed at considerably high speeds by stable direct current sputtering. This technique is made possible because the electric resistivity of sintered body targets can be reduced to 10 Ω-m or less when powders of (Ba, Sr) Ti oxides are sintered in a vacuum or in an inert atmosphere to form a target of oxygen-deficient oxides.

Sputtering methods which operate at higher electric power have been required in recent years in order to form sputtered films at higher speeds. However, there are some problems which are known concerning these higher power methods, which include the fact that the dielectric targets are brittle and easily crack during the sputtering process under high electric power, thereby interfering with stable film formation at high speeds. A need, therefore, continues to exist for improvements in the dielectric targets employed in rapid sputtering processes at high speed.

SUMMARY OF THE INVENTION

Accordingly, one object of the present invention is to provide a sputtering target of a dielectric for high speed sputtering which has a high thermal shock resistance and excellent properties in comparison to others, which dielectrics do not form cracks during sputtering under high electric power.

Briefly, this object and other objects of the invention as hereinafter will become more readily apparent can be attained by a dielectric sputtering target of a sintered barium, strontium titanate body, which is oxygen deficient, of the formula: $Ba_{1-x}Sr_xTiO_{3-y}$, (wherein $0<x<1$ and $0<y\leq0.03$), said sintered body having a mean grain size of 0.3 to 5 μm, a maximum grain size of 20 μm or less, a relative density of 95% to 99%, a purity of 4N or more, a K content of 1 ppm or less, a Na content of 2 ppm or less, an Al content of 5 ppm or less, a Si content of 20 ppm or less and a Fe content of 2 ppm or less, and a flexural strength of 150 MPa or more.

In another embodiment of the invention, the present dielectric having high strength is prepared by hot pressing a powder material having a mean primary particle size of 1 μm or less at a sintering temperature of 1100° C. to 1300° C. for a sintering time of 1 hr to 10 hrs at maximum temperature under a pressure of 10 MPa to 50 MPa in a vacuum or under an inert gas atmosphere.

DETAILED DESCRIPTION OF THE PREFERRED EMBODIMENTS

The sputtering target of the invention prepared from the present sintered body has a high density, as well as a fine micro-structure. It has an improved three point flexural strength of 150 MPa or more which is 2 to 5 times as large as that of the (Ba,Sr)TiO₃ sintered body. Improvements in the strength of dielectric sputtering targets achieved in the present invention comply with the requirements for sputtering under high DC power. A part of the invention is the discovery that the trace impurities content of such as K, Na and the like, have great influence on the flexural strength of the sintered body.

In the method of the invention highly purified powders of BaO, SrO and TiO₂ are first prepared by recrystallization or distillation. These powders are mixed together in a prescribed ratio and the mixture is heat-treated at 1100° C. in the air followed by crushing and grinding, thereby preparing powdered (Ba,Sr) TiO₃ having a perovskite crystal structure with a purity of 4N or more. The mean primary particle size of this powder is 0.05 to 1 μm.

A hot-press graphite mold is filled with the above powder and the powder is subjected to hot-pressing in a vacuum or in an atmosphere of an inert gas at a sintering temperature of 1100° C. to 1300° C. for a sintering time of 1 hr to 10 hrs at maximum temperature under a pressure of 10 MPa to 50 MPa. A sintered body, having the formula: $Ba_{1-x}Sr_xTiO_{3-y}$ ($0<x<1.0$, $0<y\leq0.03$), which is oxygen deficient, having a mean grain size of 0.3 to 5 μm, a maximum grain size of 20 μm or less and a relative density of 95% to 99% is thus prepared.

Flexural strength is measured using a test piece that is cut from the sintered body prepared above. The mean flexural strength of the test piece is 150 MPa or more, and is 2 to 5 times as high as that of conventional sintered bodies.

The sintered body obtained is then formed into a plate having a dimension of 125 mm (diameter)×5 mm (thickness), which is bonded to a backing plate made of copper using In—Sn solder. The sputtering target thus prepared is subjected to a break resistance test under direct current sputtering power and to a film forming speed test. The results show that sputtering is possible without breaking the test target up to a sputtering power of DC 600 (W) and at a film-forming speed of 250 Å/min or more. This value is 2 to 3 times as high as the values of conventional targets. These results indicate that the sintered body of the present invention is useful as a high strength, dielectric sputtering target, which has an excellent performance even under high sputtering power conditions.

The powdered material for producing the present sintered body is highly purified by repeated recrystallization and distillation, thereby adjusting the amounts of the trace impurities in the powder material such that the content of K is 1 ppm or less, Na is 2 ppm or less, Al is 5 ppm or less, Si is 20 ppm or less and Fe is 2 ppm or less. The sputtering target thus obtained is able to be subjected to sputtering under a higher sputtering power without causing any breakage besides having a higher maximum film-forming speed. These observations indicate that purification of the powder material improves the characteristic of the high strength dielectric sputtering target.

The reason why the values are limited to the aforementioned ranges are:

(a) Mean grain size of the sintered body:

If the value exceeds 5 μgm, the mean break-resistance strength decreases which results in breakage of the sputtering target material during sputtering even at low sputtering power. If the value is less than 0.3 μm, on the other hand, it is difficult to produce a sintered body having a high density by the production technique of the present invention. Therefore, the value is limited to the range of 0.3 to 5 μm.

(b) Maximum grain size of the sintered body:

The value is limited to 20 μm or less because, if the value is over 20 μm, the mean break-resistance strength of the sintered body decreases substantially, thereby resulting in breakage of the target material during sputtering even at low sputtering power.

(c) Relative density of the sintered body:

The reason why the value is limited to the range of 95% to 99% is, that if is less than 95%, the high strength of the sintered body is sacrificed, while the thermal shock resistance reduces if the value exceeds 99%.

(d) Purity of the sintered body

The purity of the sintered body is established to at least 4N because the growth of grains in the sintered body tends to accelerate at a purity below 4N.

(e) Contents of trace impurities

The contents of K, Na, Al, Si and Fe, as impurities, are adjusted as required to 1 ppm or less, 2 ppm or less, 5 ppm or less, 20 ppm or less and 2 ppm or less for the purpose of preventing the target material from breaking.

(f) The mean primary particle size of the powder material.

The value should be desirably 1 $\mu$m or less, because, if it exceeds 1 $\mu$m, the grain size of the sintered body would be more than 5 $\mu$m, which results in a decrease in the mean break-resistant strength and breakage of the target material during sputtering under low DC power.

(g) Sintering temperature and sintering time

The sintering temperature and sintering time have the effects of controlling the density and grain size of the sintered oxide body. If the sintering temperature and sintering time at a maximum temperature are less than 1100° C. and 1 hr, respectively, the required high density can not be attained while, if the values exceed 1300° C. and 10 hrs, the grain size would be out of the required range because of grain growth. Therefore, it is desirable to adjust the sintering temperature and sintering time at a maximum temperature to within the range of 1100° C. to 1300° C. and 1 hr to 10 hrs, respectively.

(h) The hot-pressing pressure

The hot-pressing pressure also has the effect of controlling the density and grain size of the sintered body of oxides. A pressure range of 10 MPa to 50 MPa is desirable to obtain the prescribed density and grain size.

Having now generally described this invention, a further understanding can be obtained by reference to certain specific examples which are provided herein for purposes of illustration only and are not intended to be limiting unless otherwise specified.

EXAMPLES 1–8

Powders of highly purified BaO and SrO are obtained by thermal decomposition of Ba acetate and Sr acetate respectively, each having been highly purified by recrystallization.

Titanium tetrapropoxide, highly purified by distillation, is dissolved in isopropyl alcohol and hydrolyzed by treatment with water. A powder of highly purified $TiO_2$ is obtained by thermal decomposition of the precipitate after hydrolysis.

A number of powder mixtures were prepared as shown in Table 1. Each powder mixture was prepared by mixing the oxides in a prescribed mixing ratio and the mixture was heat-treated at 1100° C. in the air followed by crushing and grinding, thereby preparing a powder of $(Ba_{0.5}Sr_{0.5})TiO_{3.00}$ having a purity of 4 Nines or more and having a perovskite crystal structure. (The oxide compositions of all examples and comparative examples in Table 1 have this formula.)

The mean primary particle/size of each powder is shown in Table 1. The sizes range from 0.3 $\mu$m to 0.9 $\mu$m according to the particular crushing and grinding conditions employed.

A hot-press graphite mold is filled with a powder to form a body having a diameter of 130 mm, which is subjected to hot-pressing in a vacuum ($5 \times 10^{-2}$ Pa) under a pressure of 20 MPa for 3 hrs at a temperature between 1150~1300° C., thereby preparing a sintered body having a density (relative density) of 95–99%. The sintering temperature, density of sintered body and relative density are shown in Table 1.

The appearance of each sintered body after removal of the rough surface by wet surface grinding and polishing is a black color. The specific resistance of each sintered body (target) is shown in Table 1.

The assay results show that the target composition of the sintered body of Example 1 is $(Ba_{0.5}Sr_{0.5})TiO_{2.99}$, while the target oxide formulas of the remaining seven examples is $(Ba_{0.5}Sr_{0.5})TiO_{2.97}$. These formulas indicate an oxygen deficient state for the mixed oxide preparations, because sintering was conducted in a reduced atmosphere.

The mean grain size on the polished surface of each sintered body, as determined by an intercept method under a scanning electron microscope (SEM), is shown in Table 1. The maximum and minimum grain size distributions, determined by image analysis, are shown in Table 1. These size distributions are in the range of 0.1 to 20 $\mu$m.

The contents of impurities are analyzed quantitatively at the peripheral position of each sintered body for Na, K, Al, Si and Fe and the results are shown in Table 1.

Test pieces of a dimension of 4 mm×3 mm×40 mm are cut off from each sintered body prepared under the same conditions as described above. Ten test pieces are prepared by polishing the surfaces of the test pieces with a sheet of #1500 Emery polishing paper after C 0.1 grade of chamfering. The flexural strength test is applied to ten test pieces of each target. The mean flexural strength of each target is shown in Table 1.

Each sintered body, prepared as described above, is formed into a disc with a dimension of 125 mm in diameter and 5 mm in thickness. A dielectric sputtering target of high strength of the present invention is prepared upon bonding to a backing plate made of copper using In—Sn solder and the target is subjected to a break-resistance test and film-forming speed test by applying DC sputtering power under the test conditions shown in Table II. The results are shown Table 1. These results indicate that sputtering is possible until the DC power is increased to 600 W without any breakage and the maximum film-forming speed is 230~410 Å/min.

TABLE II

| Break-Resistance Test under DC Sputtering | |
|---|---|
| Applied electric power (W) | : 50, 100, 150, 200 - - - (stepwise increase by 50(W)) |
| Film-forming time (min) | : 10 |
| Substrate | : φ 5 inch silicon wafer |
| Distance between substrate and target (mm) | : 70 |
| Temperature of the substrate (° C.) | : 600 |
| Sputtering gas pressure (Pa) | : 1 |
| Sputtering gas | : $Ar/O_2 = 9/1$ |
| Pulse frequency (KHz) | : 100 |
| Duty (%) | : 20 |

Comparative Examples 1–3

Powdered $(Ba_{0.5},Sr_{0.5})TiO_{3.00}$ samples having a purity of 4N or more and having a perovskite crystal structure are prepared in the same way as described in the examples above. Thereafter, the oxide samples are processed in the manner previously described to prepare targets. The targets were examined.

The results obtained are shown in Table 1. The compositions of the sintered oxide targets are shown in the Table with the sintered oxide of Comparative Example 1 having the formula: $(Ba_{0.5},Sr_{0.5})TiO_{2.98}$, and the sintered oxides of Comparative Examples 2 and 3 having the formula: $(Ba_{0.5}, Sr_{0.5})TiO_{2.97}$.

Comparative Examples 4–10

Powdered $BaTiO_3$ having a purity of 3N and a mean primary particle size of 0.1 $\mu$m and powdered $SrTiO_3$ having a purity of 3N and a mean primary particle size of 0.1 $\mu$m were wet-blended and the mixture was calcined at 1150° C. in the air followed by crushing and grinding. A powder having he formula: $(Ba_{0.5},Sr_{0.5})TiO_{3.00}$ with a purity of 3N and a perovskite crystal structure was prepared. Seven samples, all having the stoichiometry of the formula: $(Ba_{0.5}, Sr_{0.5})TiO_{3.00}$, were prepared.

Subsequently, in the manner described examples above, targets were prepared from these seven samples and were tested.

The results of the tests are shown in Table 1. The compositions of the sintered oxide targets are shown in the Table and each have the formula: $(Ba_{0.5},Sr_{0.5})TiO_{2.97}$.

As shown by the experimental data in Table 1, sputtered films are formed at higher speeds without any breakage of the dielectric target in the case of Examples 1–8. The targets of these examples of the present invention have higher strength even when the electric power density for sputtering is increased. On the other hand, high-speed film formation was impossible with Comparative targets 1 to 10 because they broke at lower electric power densities during sputtering. The examples of the target materials of the present invention have a high strength because of their high purity, high density and fine micro-structure.

TABLE I

|  | Calcining Temperature (° C.) | Purity | Mean Primary Particle Size ($\mu$m) | Sintering Temperature (° C.) | Density of Sintered body (g/cm$^3$) | Relative Density (%) | Mean Grain Size ($\mu$m) | Minimum Grain Size ($\mu$m) | Maximum Grain Size ($\mu$m) | Content of Impurity | | |
|---|---|---|---|---|---|---|---|---|---|---|---|---|
|  |  |  |  |  |  |  |  |  |  | Na (ppm) | K (ppm) | Al (ppm) |
| Examples |  |  |  |  |  |  |  |  |  |  |  |  |
| 1 | 1100 | >4N | 0.5 | 1150 | 5.35 | 95 | 0.8 | 0.1 | 10 | <1 | <1 | 3 |
| 2 | 1100 | >4N | 0.9 | 1200 | 5.43 | 96.5 | 1.7 | 0.1 | 10 | <1 | <1 | 2 |
| 3 | 1100 | >4N | 0.3 | 1250 | 5.51 | 97.8 | 2.2 | 0.5 | 20 | <1 | <1 | 2 |
| 4 | 1100 | >4N | 0.7 | 1275 | 5.55 | 98.6 | 3.5 | 0.5 | 20 | <1 | <1 | 2 |
| 5 | 1100 | >4N | 0.5 | 1300 | 5.57 | 99 | 4.6 | 0.5 | 20 | <1 | <1 | 1 |
| 6 | 1100 | >4N | 0.5 | 1300 | 5.55 | 98.5 | 2.2 | 0.5 | 20 | <1 | <1 | 1 |
| 7 | 1100 | >4N | 0.6 | 1300 | 5.53 | 98.3 | 2.4 | 0.5 | 20 | <1 | <1 | 5 |
| 8 | 1100 | >4N | 0.5 | 1300 | 5.57 | 98.9 | 3.6 | 0.5 | 20 | <1 | <1 | 1 |
| Comparative Examples |  |  |  |  |  |  |  |  |  |  |  |  |
| 1 | 1100 | >4N | 0.4 | 1050 | 5.08 | 90.2 | 0.6 | 0.1 | 10 | 2 | 1 | 35 |
| 2 | 1300 | >4N | 8.3 | 1350 | 5.53 | 98.3 | 6.5 | 1 | 50 | 2 | 1 | 10 |
| 3 | 1100 | >4N | 0.6 | 1400 | 5.6 | 99.5 | 81 | 10 | 200 | 1 | 4 | 70 |
| 4 | 1150 | >3N | 0.4 | 1300 | 5.57 | 98.9 | 25 | 5 | 80 | 3 | 1 | 5 |
| 5 | 1150 | >3N | 1.5 | 1300 | 5.53 | 98.3 | 68 | 5 | 150 | 3 | 1 | 4 |
| 6 | 1150 | >3N | 0.6 | 1300 | 5.54 | 98.4 | 12 | 5 | 50 | 2 | 2 | 80 |
| 7 | 1150 | >3N | 0.8 | 1300 | 5.55 | 98.5 | 20 | 5 | 100 | 10 | 1 | 5 |
| 8 | 1150 | >3N | 1.5 | 1300 | 5.48 | 97.3 | 53 | 5 | 150 | 8 | 3 | 10 |
| 9 | 1150 | >3N | 0.9 | 1300 | 5.52 | 98 | 88 | 10 | 200 | 20 | 5 | 18 |
| 10 | 1150 | >3N | 3.8 | 1300 | 5.52 | 98 | 126 | 50 | 300 | 15 | 3 | 120 |

|  | Content of Impurity | | Mean Flexural Strength (Mpa) | Specific Resistance ($\times 10^{-3} \Omega \cdot cm$) | Breakage DC Power (w) | Sputtering Rate (Å/min) |
|---|---|---|---|---|---|---|
|  | Si (ppm) | Fe (ppm) |  |  |  |  |
| Examples |  |  |  |  |  |  |
| 1 | 17 | 2 | 165 | 90 | 350 | 250 |
| 2 | 14 | 1 | 188 | 80 | 450 | 290 |
| 3 | 11 | 1 | 235 | 60 | 500 | 320 |
| 4 | 9 | 1 | 362 | 60 | 550 | 350 |
| 5 | 8 | 1 | 283 | 40 | 550 | 350 |
| 6 | 1 | <1 | 355 | 30 | 600 | 410 |
| 7 | 10 | 1 | 293 | 40 | 550 | 360 |
| 8 | 18 | 2 | 276 | 30 | 550 | 360 |
| Comparative Examples |  |  |  |  |  |  |
| 1 | 300 | 10 | 51 | 150 | 150 | 90 |
| 2 | 30 | 5 | 103 | 50 | 200 | 150 |
| 3 | 20 | 20 | 75 | 20 | 150 | 100 |
| 4 | 50 | 10 | 123 | 40 | 250 | 180 |

TABLE I-continued

| | | | | | | |
|---|---|---|---|---|---|---|
| 5 | 40 | 10 | 105 | 50 | 200 | 130 |
| 6 | 18 | 3 | 118 | 50 | 250 | 180 |
| 7 | 75 | 5 | 107 | 40 | 250 | 170 |
| 8 | 80 | 15 | 107 | 60 | 200 | 130 |
| 9 | 150 | 20 | 70 | 50 | 150 | 100 |
| 10 | 200 | 35 | 46 | 50 | 100 | 70 |

Having now fully described the invention, it will be apparent to one of ordinary skill in the art that many changes and modifications can be made thereto without departing from the spirit or scope of the invention as set forth herein.

What is claimed as new and is desired to be secured by Letters Patent of the United States is:

1. A dielectric sputtering target comprising: a sintered barium, strontium titanate body, which is oxygen deficient, of the formula: $Ba_{1-x}Sr_xTiO_{3-y}$, wherein $0<x<1$ and $0<y\leq0.03$, said sintered body having a mean grain size of 0.3 to 5 μm, a maximum grain size of 20 μm or less, a relative density of 95% to 99%, a purity of 4N or more, a K content of 1 ppm or less, a Na content of 2 ppm or less, an Al content of 5 ppm or less, a Si content of 20 ppm or less, an Fe content of 2 ppm or less and a mean flexural strength of 150 MPa or more.

2. A method for producing a dielectric sputtering target of a sintered (barium, strontium) titanate body, which is oxygen deficient, and which has the formula: $Ba_{1-x}Sr_xTiO_{3-y}$, wherein $0<xx<1$ and $0<y\leq0.03$, the sintered body having a mean grain size of 0.3–5 μm, a maximum grain size of 20 μm or less, a relative density of 95–99%, a purity of 99.99% or more, a K content of 1 ppm or less, a Na content of 2 ppm or less, and Al content of 5 ppm or less, a Si content of 20 ppm or less, an Fe content of 2 ppm or less and a mean flexural strength of 150 MPa or more, comprising:

hot-press sintering a powdered material of the formula: $Ba_{1-x}Sr_xTiO_{3.00}$, wherein $0<x<1$ having a mean primary particle size of 1 μm or less at a sintering temperature of 1100–1300° C. for a sintering time of 1–10 hours at a maximum temperature under a pressure of 10 MPa to 50 MPa in a vacuum or in an atmosphere of an inert gas.

3. A dielectric sputtering target comprising: a sintered barium, strontium titanate body, which is oxygen deficient, of the formula: $Ba_{1-x}Sr_xTiO_{2.99-2.97}$, wherein $0<x<1$, said sinted body having a mean grain size of 0.3–5 μm, a maximum grain size of 20 μm or less, a relative density of 95–99%, a purity of 4N or more, a K content of 1 ppm or less, a Na content of 2 ppm or less, and Al content of 5 ppm or less, a Si content of 20 ppm or less, an Fe content of 2 ppm or less and a mean flexural strength of 150 MPa or more.

4. A dielectric sputtering target comprising: a sintered barium, strontium titanate body, which is oxygen deficient, of the formula: $Ba_{1-x}Sr_xTiO_{3-y}$, wherein $0<x<1$ and $0<y<0.03$, said sintered body having a mean grain size of 0.3–5 μm, a maximum grain size of 20 μm or less, a relative density of 95–99%, a purity of 4N or more, a K content of 1 ppm or less, a Na content of 2 ppm or less, and Al content of 5 ppm or less, a Si content of 20 ppm or less, an Fe content of 2 ppm or less and a mean flexural strength of 150 MPa or more.

5. A dielectric sputtering target comprising: a sintered barium, strontium titanate body, which is oxygen deficient, of the formula: $Ba_{1-x}Sr_xTiO_{2.99-2.97}$, wherein $0<x<1$, said sintered body having a mean grain size of 0.3–5 μm, a maximum grain size of 20 μm or less, a relative density of 95–99%, a purity of 4N or more, a K content of 1 ppm or less, a Na content of 2 ppm or less, and Al content of 5 ppm or less, a Si content of 20 ppm or less, an Fe content of 2 ppm or less and a mean flexural strength of 150 MPa or more.

6. A dielectric sputtering target comprising: a sintered barium, strontium titanate body, which is oxygen deficient, of the formula: $Ba_{1-x}Sr_xTiO_{2.99-2.98}$, wherein $0<x<1$, said sintered body having a mean grain size of 0.3–5 μm, a maximum grain size of 20 μm or less, a relative density of 95–99%, a purity of 4N or more, a K content of 1 ppm or less, a Na content of 2 ppm or less, and Al content of 5 ppm or less, a Si content of 20 ppm or less, an Fe content of 2 ppm or less and a mean flexural strength of 150 MPa or more.

* * * * *

UNITED STATES PATENT AND TRADEMARK OFFICE
CERTIFICATE OF CORRECTION

PATENT NO. : 6,176,986
DATED : January 23, 2001
INVENTOR(S): Kazuo WATANABE, et al.

It is certified that an error appears in the above-identified patent and that said Letters Patent is hereby corrected as shown below:

On the Title page Item (30), the Foreign Application Priority Data is listed incorrectly. Item (30) should read as follows:

(30) Foreign Application Priority Data

--May 27, 1996 (JP) ............................. 8-131736 --

Signed and Sealed this

Fifteenth Day of May, 2001

*Attest:*

NICHOLAS P. GODICI

*Attesting Officer*     *Acting Director of the United States Patent and Trademark Office*